(12) United States Patent  
Qiao (10) Patent No.: US 8,093,930 B2  
(45) Date of Patent: Jan. 10, 2012

(54) HIGH FREQUENCY FRACTIONAL-N DIVIDER

(75) Inventor: Juan Qiao, Shanghai (CN)

(73) Assignee: Integrated Device Technology, inc, San Jose, CA (US)

( * ) Notice: Subject to any disclaimer, the term of this patent is extended or adjusted under 35 U.S.C. 154(b) by 0 days.

(21) Appl. No.: 12/077,651

(22) Filed: Mar. 19, 2008

(65) Prior Publication Data

US 2009/0237128 A1    Sep. 24, 2009

(51) Int. Cl.  
*H03B 19/00*    (2006.01)
(52) U.S. Cl. ...................................................... 327/117
(58) Field of Classification Search .................. None  
See application file for complete search history.

(56) References Cited

U.S. PATENT DOCUMENTS

| | | | |
|---|---|---|---|
| 6,380,774 B2* | 4/2002 | Saeki | 327/119 |
| 6,593,575 B2* | 7/2003 | Fries | 250/363.03 |
| 6,665,367 B1* | 12/2003 | Blair | 377/20 |
| 6,836,177 B2* | 12/2004 | Ito | 327/536 |
| 7,508,897 B2* | 3/2009 | Yoneu | 375/376 |
| 7,756,232 B2* | 7/2010 | Aoki et al. | 375/355 |
| 2008/0094113 A1* | 4/2008 | Kuan | 327/117 |

* cited by examiner

*Primary Examiner* — Lincoln Donovan  
*Assistant Examiner* — Sibin Chen  
(74) *Attorney, Agent, or Firm* — Hayes and Boone LLP (57) ABSTRACT

A divider can include a phase selection circuit that switches between a plurality of phase-separated clock signals in response to a fractional control signal to form a selected clock signal, the selected clock signal being utilized to generate a second clock signal; and a counter that receives the second clock signal and generates the fractional control signal and a transition control signal, the transition control signal indicating when the second clock signal should switch states in response to a transition of the selected clock signal, the counter generating a feed-back clock signal.

6 Claims, 9 Drawing Sheets

HIGH FREQUENCY FRACTIONAL-N DIVIDER

BACKGROUND

1. Technical Field of the Invention

The present invention relates to a divider, and more particularly to a high frequency 3-phase-selection fractional-N divider.

2. Discussion of Related Art

Phase-Locked Loops (PLLs) find application in various context where a stable, often high frequency, clock signal is desired. Applications of PLLs include, for example, clock generation for CPUs and for telecommunications. Often, PLLs are required to operate at high frequencies.

PLLs often need fractional-N feedback dividers, especially some given fraction feedback dividers such as $(N+\frac{1}{3})$ or $(N+\frac{2}{3})$. A divide-by-$(N+\frac{1}{3})$ or $(N+\frac{2}{3})$ is often utilized in computer clock products, for example. However, general methods of implementing fractional-N dividers such as a sigma-delta arithmetic divider, for example, are complicated for a given fraction and may occupy a large number of logic circuits within an integrated circuit to implement.

Therefore, there is a need for fractional feedback dividers that are easily implemented and require fewer logic circuits.

SUMMARY

In accordance with embodiments of the present invention, a divider that utilizes a plurality of phase clocks from a voltage-controlled oscillator (VCO) to realize a divided signal is presented.

A divider according to some embodiments of the invention can include a phase selection circuit that switches between a plurality of phase-separated clock signals in response to a switch signal to form a selected clock signal, the selected clock signal being utilized to generate a second clock signal; and a counter that receives the second clock signal and generates the fractional control signal and a transition control signal, the transition control signal indicating when the second clock signal should switch states in response to a transition of the selected clock signal, the counter generating a feed-back clock signal.

In some embodiments, the phase selection circuit provides the selected clock signal to a prescaler, which generates the second clock signal having a lower frequency that that of the plurality of phase-separated clock signals. In some embodiments, a plurality of high frequency phase separated signals are received by a plurality of high-speed prescalers, the plurality of high-speed prescalers generating the plurality of phase-separated clock signals, which are lower frequency that the plurality of high frequency phase separated signals.

A method of frequency dividing according to some embodiments of the present invention includes receiving a plurality of phase-separated clock signals; switching between the plurality of phase-separated clock signals in response to a switch signal to generate a selected clock signal; generating a second clock signal based on the selected clock signal; and generating the switch signal after N cycles of a high frequency clock signal.

These and other embodiments will be described in further detail below with respect to the following figures.

BRIEF DESCRIPTION OF THE DRAWINGS

In the drawings, elements having the same designation have the same or similar functions.

DETAILED DESCRIPTION

In the following description specific details are set forth describing certain embodiments of the invention. It will be apparent, however, to one skilled in the art that the present invention may be practiced without some or all of these specific details. The specific embodiments presented are meant to be illustrative of the present invention, but not limiting. One skilled in the art may realize other material that, although not specifically described herein, is within the scope and spirit of this disclosure.

Figure 1:
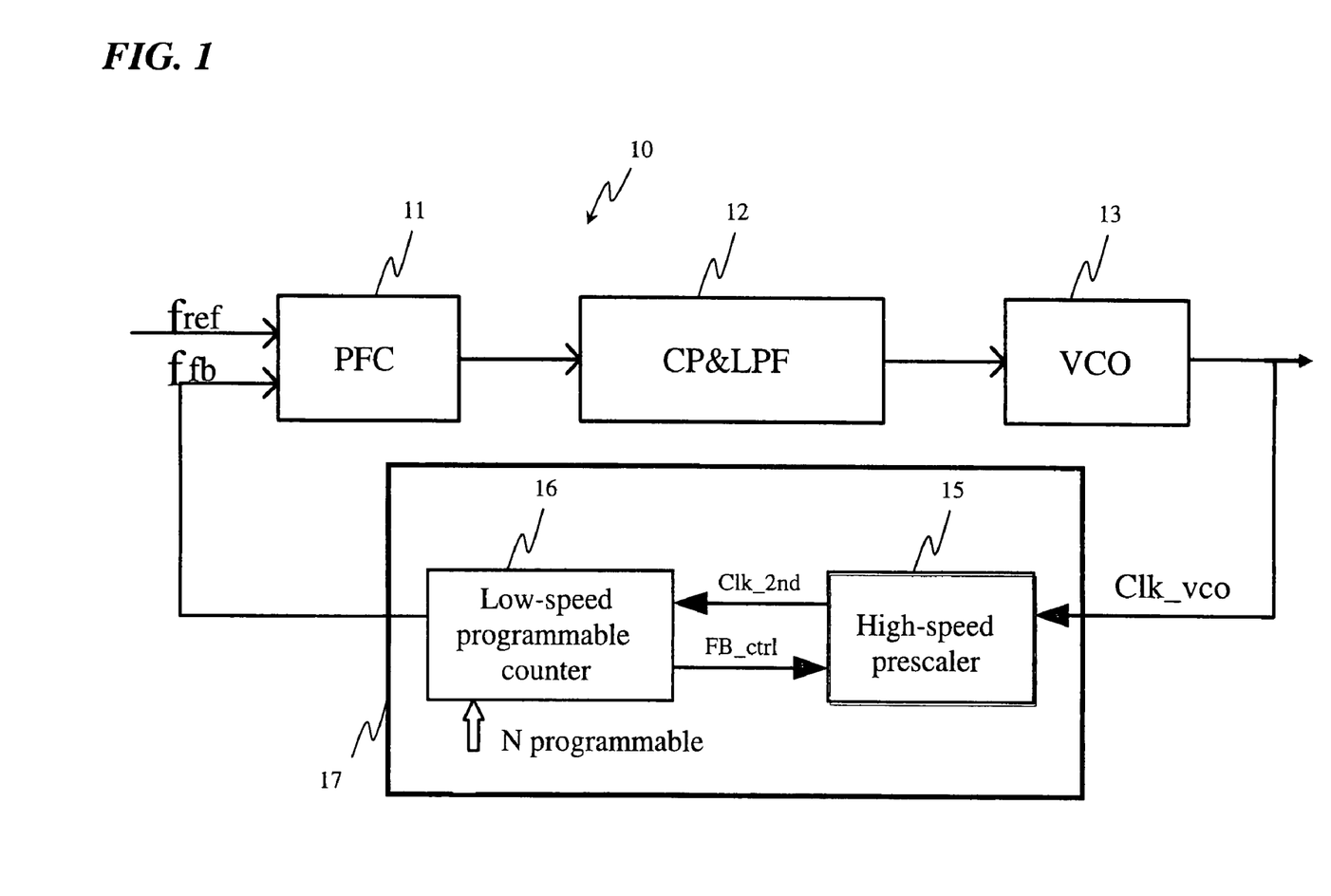
FIG. 1 shows a block diagram of a Phase-Locked-Loop with a feedback divider according to some embodiments of the present invention.

FIG. 1 illustrates a phase-locked-loop (PLL) 10 according to some embodiments of the present invention. PLL 10 includes a Phase Frequency Comparator (PFC) 11, a Charge Pump & Low-pass Filter (CP&LPF) 12, a voltage-controlled-oscillator (VCO) 13, and a feedback divider 17. In embodiments such as that shown in FIG. 1, feedback divider 17 can be implemented as a high-speed prescaler 15 and a low-speed programmable counter 16.

As shown in FIG. 1, a feedback clock operating at frequency $f_{fb}$ (clock signal $f_{fb}$), which is generated by feedback divider 17, is compared with a reference clock operating at reference frequency $f_{ref}$ (clock signal $f_{ref}$) in PFC 11. A signal related to the comparison is input to CP&LPF 12, which generates a voltage input signal to VCO 13. VCO 13 outputs a plurality of phase-separated clock signals, each having a frequency determined by the voltage input to VCO 13, and each having a different phase. In general, VCO 13 can generate any number of signals of different phase, each with the frequency determined by the voltage input. An example of a timing diagram where VCO 13 generates three (3) phase separated clock signals ph1, ph2, and ph3 is shown in FIG. 2.

Figure 2:
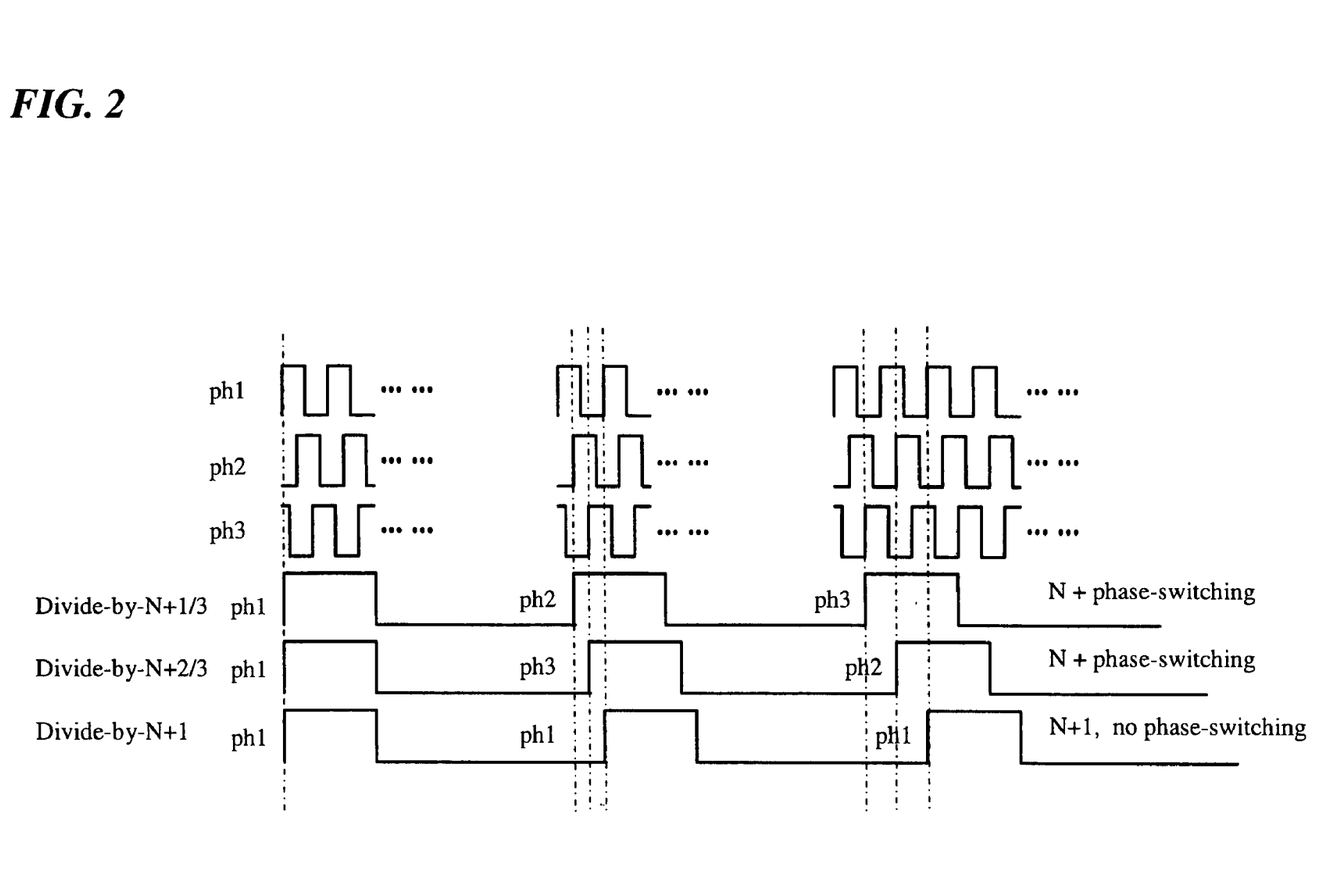
FIG. 2 illustrates a waveform diagram showing three phase separated clocks transmitted from a VCO and divided signals generated by a feedback divider according to some embodiments of the present invention.

FIG. 2 shows an example where three phase-separated clock signals are generated by VCO 13. The three phase-separated clock signals produced by VCO 13 shown in FIG. 2 are labeled ph1, ph2, and ph3 and differ in phase by 120 degrees. These signals are input into feedback divider 17, which can realize divide-by-$(N+\frac{1}{3})$, $(N+\frac{2}{3})$, or $(N+1)$ by phase-switching between the three phase-separated clock signals ph1, ph2, and ph3. Taking divide-by-$(N+\frac{1}{3})$ as the example, the fraction $\frac{1}{3}$ can be achieved by switching on the rising edges of signals ph1, ph2, and ph3 in turn, and the N portion is achieved by timing in high-speed prescaler 15 and low-pass programmable counter 16. As further shown, divide-by-$N+\frac{2}{3}$ is achieved by switching between signals ph1, ph2, and ph3 alternately (i.e., ph1 to ph3 to ph2 to ph1). The divide-by-N+⅓, divide-by-N+⅔, and divide-by-N+1 are similarly achieved as illustrated in the timing diagram shown in FIG. 2.

Figure 3:
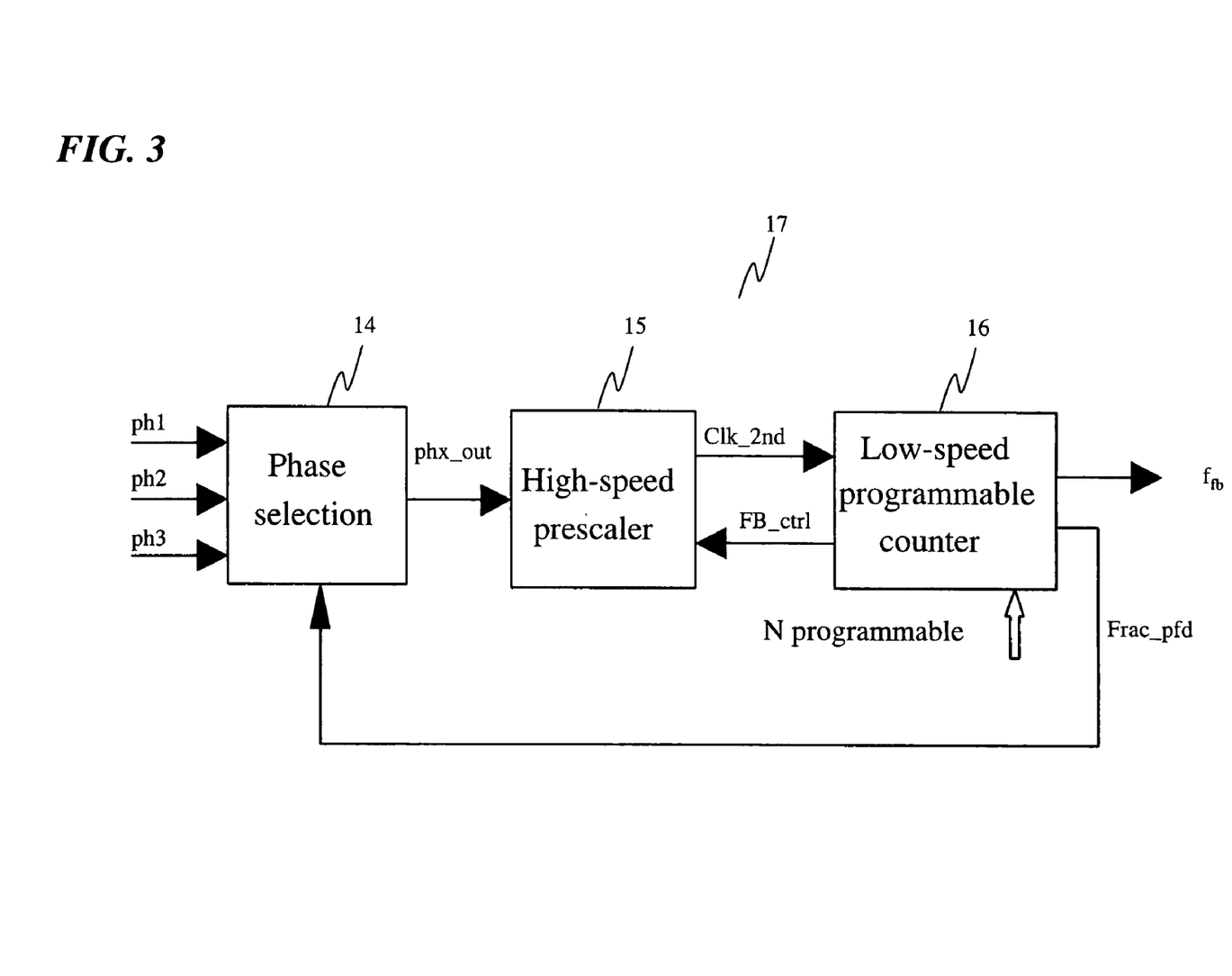
FIG. 3 shows a block diagram of a feedback divider according to some embodiments of the present invention.

FIG. 3 illustrates a feedback divider 17 according to some embodiments of the present invention. As shown in the embodiments of feedback divider 17 illustrated in FIG. 3, a phase-selection module 14 receives the three phase-separated VCO generated clock signals ph1, ph2, and ph3 and provides a phx_out signal to high-speed prescaler 15. Phase-selection module 14 receives clock signals ph1, ph2, and ph3 from VCO 13 and switches between them to transmit clock signal phx_out. The signal phx_out is the selected one of clock signals ph1, ph2, and ph3. High-speed prescaler 15 receives the signal phx_out and produces a signal Clk_2nd in accordance with a signal FB_ctrl from low-pass programmable counter 16. Low-speed programmable counter 16 transfers a feed-back clock signal $f_{fb}$ as well as supplies a signal Frac_pfd. The signal Frac_pfd (a switch signal) indicates to phase selection 14 when to switch to the next selected one of clock signals ph1, ph2, or ph3. The signal FB_ctrl (a transition control signal) indicates to high-speed prescaler 15 when to switch from a high signal (logic "1") to a low signal (logic "0") or from low signal to a high signal.

Although an example that illustrates three frequency-separated clock signals that are separated in phase by 120 degrees is specifically disclosed herein, in general any number of frequency-separated clock signals can be utilized in other embodiments of the invention. Further, the phase separation between the phase-separated signals is not limited to 120 degrees.

In operation, high-speed prescaler 15 switches from low to high in response to the signal FB_ctrl and on the rising edge of the signal phx_out. Low-speed programmable counter 16 counts through N cycles of ph1 switches the signal FB_ctrl at specified counts, and sets the feed back clock signal $f_{fb}$ when N is reached. As shown in FIG. 3, low-speed programmable counter 16 is clocked by low frequency signal Clk_2$^{nd}$ rather than high frequency signal ph1. For every N+⅓ of signal ph1 the signal phx_out is generated by switching in signals ph1, ph2, and ph3 in turn. As before, divide-by-N+⅔ is accomplished by switching between signals ph1, ph2, and ph3 in an alternate fashion.

Figure 4:
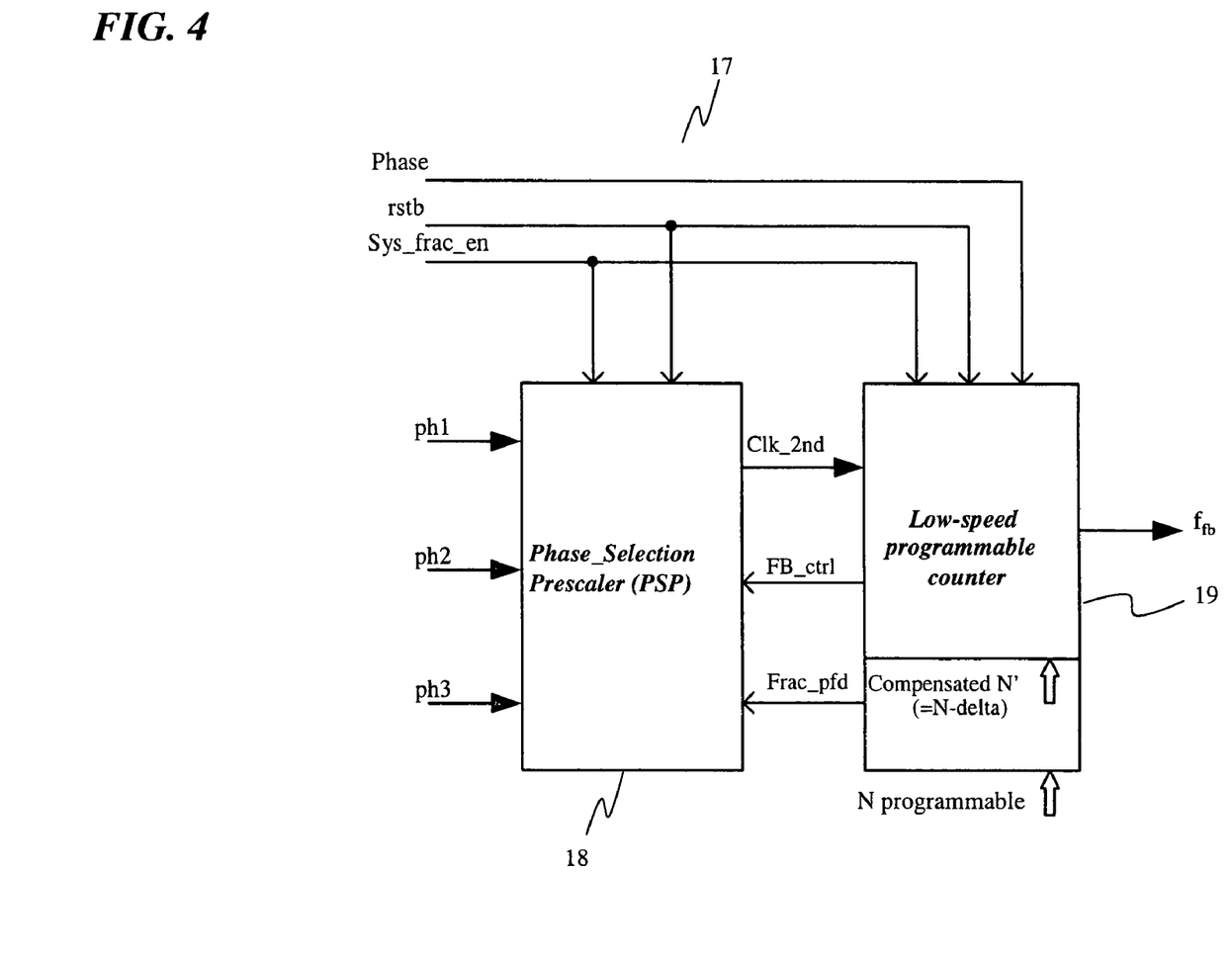
FIG. 4 shows a block diagram of another feedback divider according to some embodiments of the present invention.

FIG. 4 illustrates another embodiment of feedback divider 17. When the VCO 13 is running at about 1 GHz, glitch-free switching may be easier to achieve with the embodiment of feedback divider 17 shown in FIG. 4 rather than that illustrated in FIG. 3. The embodiment of feedback divider 17 shown in FIG. 4 includes a Phase-Selection Prescaler (PSP) 18 and a Low-speed programmable counter 19. PSP 18 receives signals ph1, ph2, and ph3 from VCO 13 and transmits a signal Clk_2nd in accordance with signals FB_cntrl and Frac_pfd, which are generated from low-speed programmable counter 19. Low-speed programmable counter 19 generates the signal Frac_pfd and a compensation delta for achieving the N component, which may be realized by low speed logic. The low-speed programmable counter 19 receives the signal Clk_2nd and transfers feedback clock signal $f_{fb}$. Low-speed programmable counter 19 also generates the signal Frac_pfd, which indicates to PSP 18 when to shift between signals ck1, ck2, and ck3 as illustrated in FIG. 5.

Figure 5:
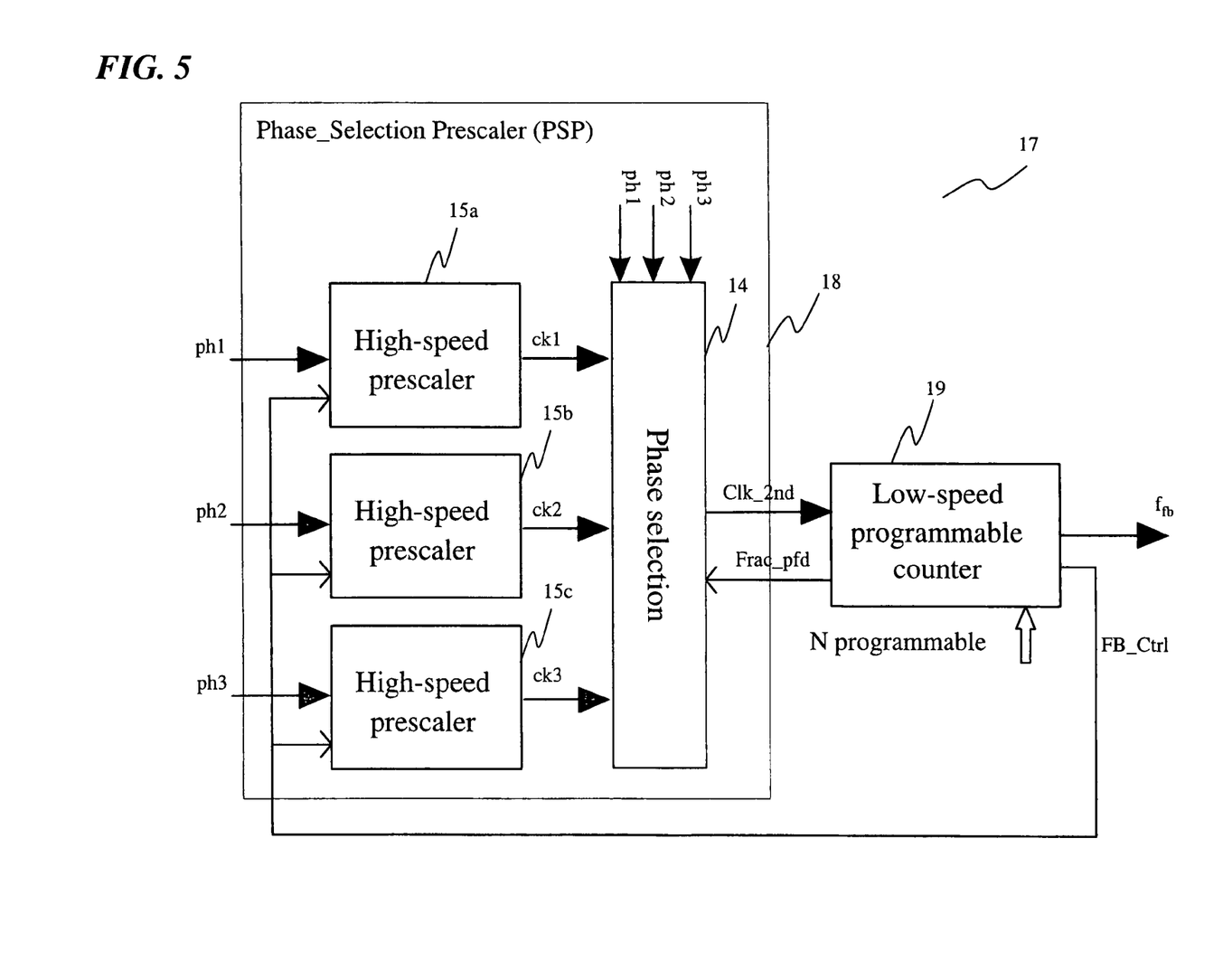
FIG. 5 shows a more detailed block diagram of a feedback divider as shown in FIG. 4.

FIG. 5 illustrates an embodiment of PSP 18 according to the present invention. As shown in FIG. 5, PSP 18 includes phase-selection 14 and high-speed prescalers 15a, 15b, and 15c. Feedback divider 17 includes PSP 18 and low-speed programmable counter 19. High-speed prescalers 15a, 15b, and 15c input signals ph1, ph2, and ph3, respectively, and generates clock signals ck1, ck2, and ck3, respectively, which are at lower frequencies than signals ph1, ph2, and ph3, respectively. As a result of the lower frequency clock signals ck1, ck2, and ck3, more timing margin is provided to switching clock signals ck1, ck2, and ck3 than there is in directly switching the higher-frequency signals ph1, ph2, and ph3, as was illustrated in phase selection 14 of FIG. 3.

Figure 6:
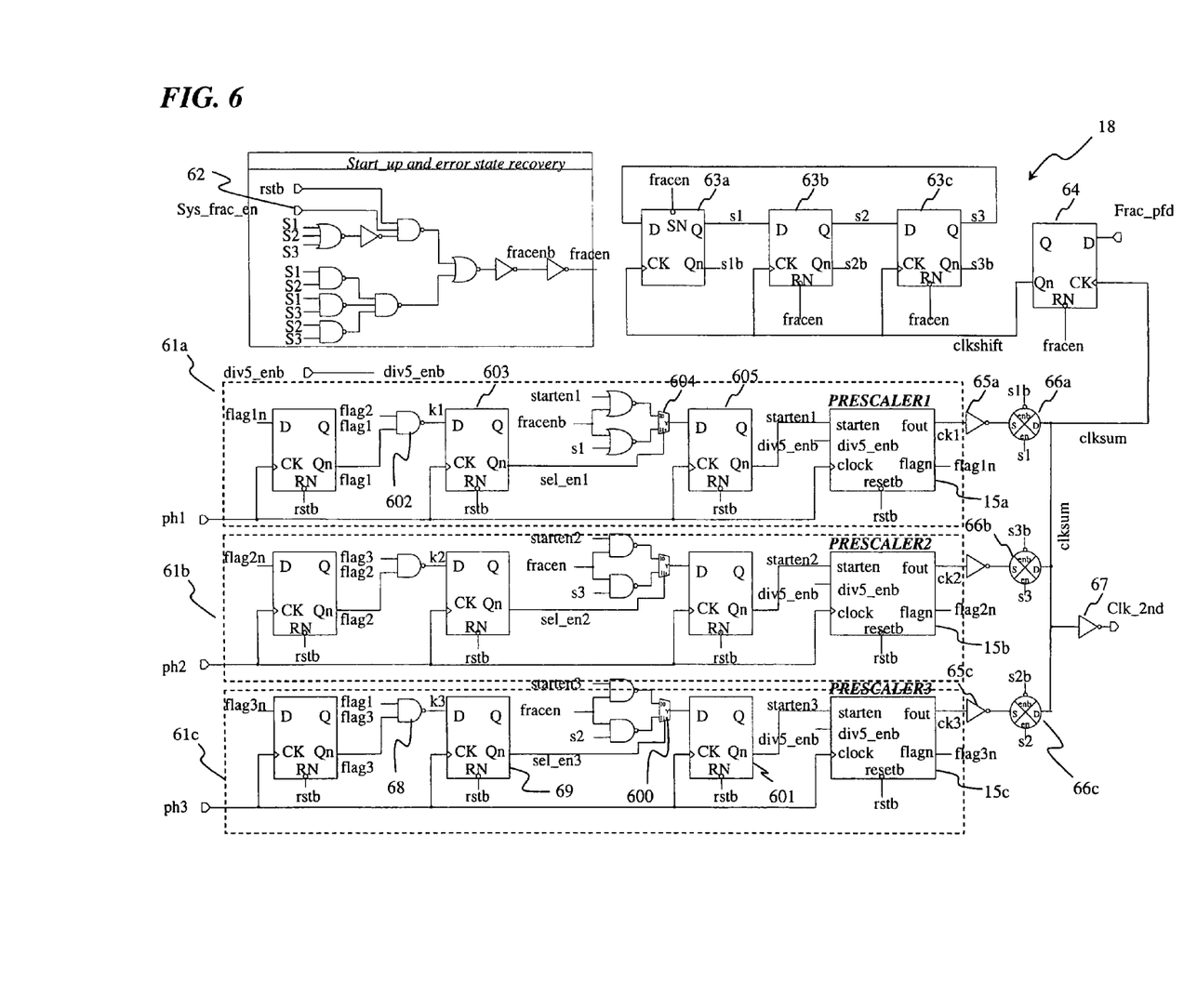
FIG. 6 shows a more detailed block diagram of a configuration of a pre-selection prescaler as illustrated in FIG. 4.

An example of PSP 18 is schematically illustrated in FIG. 6. As shown in FIG. 6, PSP 18 includes circuits 61a, 61b, and 61c. Circuits 61a, 61b, and 61c include high-speed prescalers 15a, 15b, and 15c, respectively, and input phase-separated signals ph1, ph2, and ph3, respectively. When one of high-speed prescalers 15a, 15b, and 15c is selected, the remaining high-speed prescalers are in a standby mode. Once switching happens, the running high-speed prescaler is held, and then the next high-speed prescaler is started.

Figure 7:
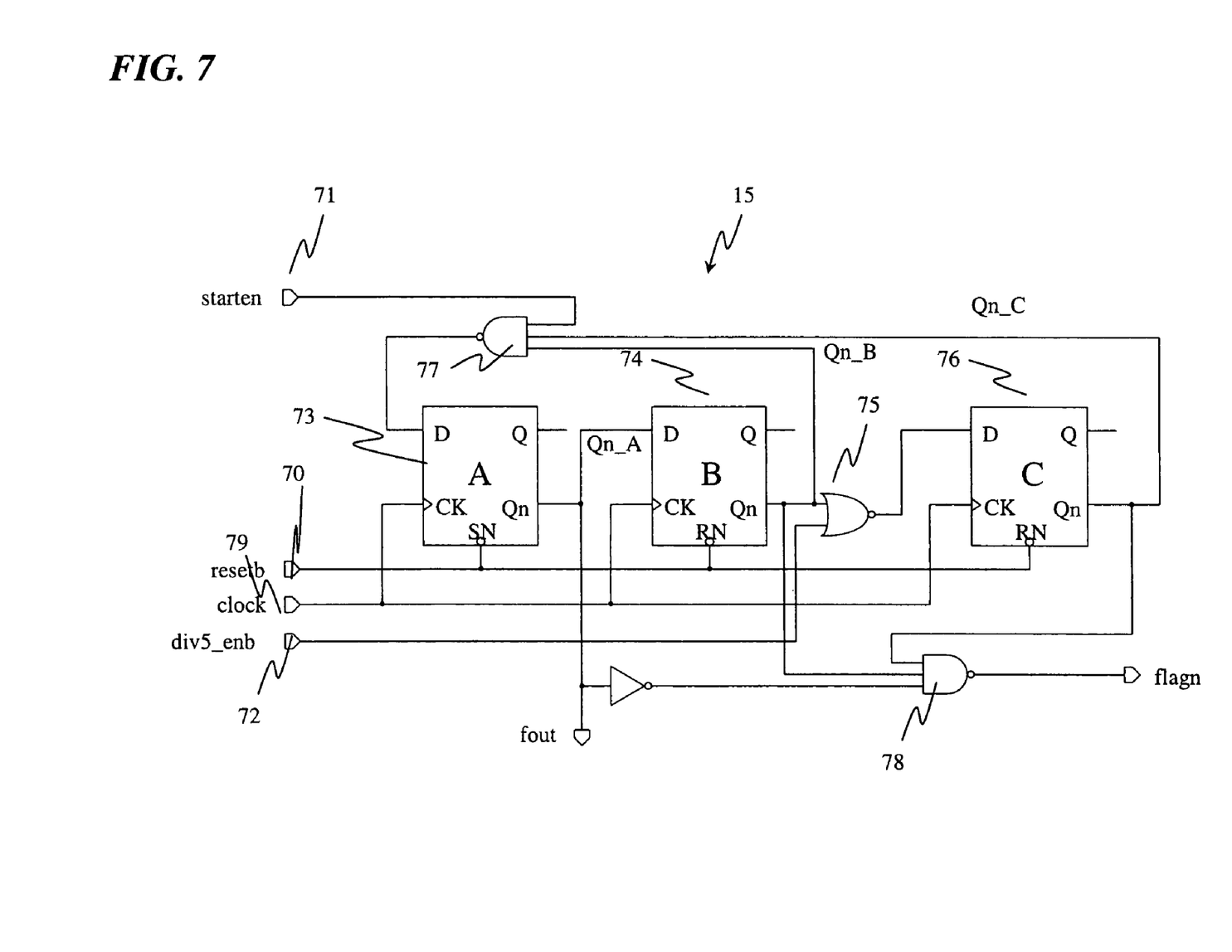
FIG. 7 shows a circuit diagram of a configuration of a high-speed prescaler as shown in FIG. 6.

A configuration of high-speed prescalers 15a, 15b, and 15c is schematically shown as high-speed prescaler 15 in FIG. 7. In the embodiment of high-speed prescaler 15 shown in FIG. 7, a divide-by-4- or divide-by-5 function is implemented. High-speed prescaler 15 receives a signal starten at a starten terminal 71, a clock signal at a clock terminal 79, and a signal div5_enb at div5_enb terminal 72. As shown in FIG. 4, the signal div5_enb is supplied by low-speed programmable counter 18. When the signal div5_enb is logic "0," the high-speed prescaler 15 implements a divide-by-5 function and when the signal div5_enb is logic "1", prescaler 15 implements a divide-by-4. When a logic "1" state of signal div5_enb is input into a NOR 75, NOR 75 outputs a logic "0," which is coupled into a D-terminal of a Flip-Flop 76. Therefore, the Flip-Flop 76 transmits a logic "1" as signal Qn_C.

Figure 8:
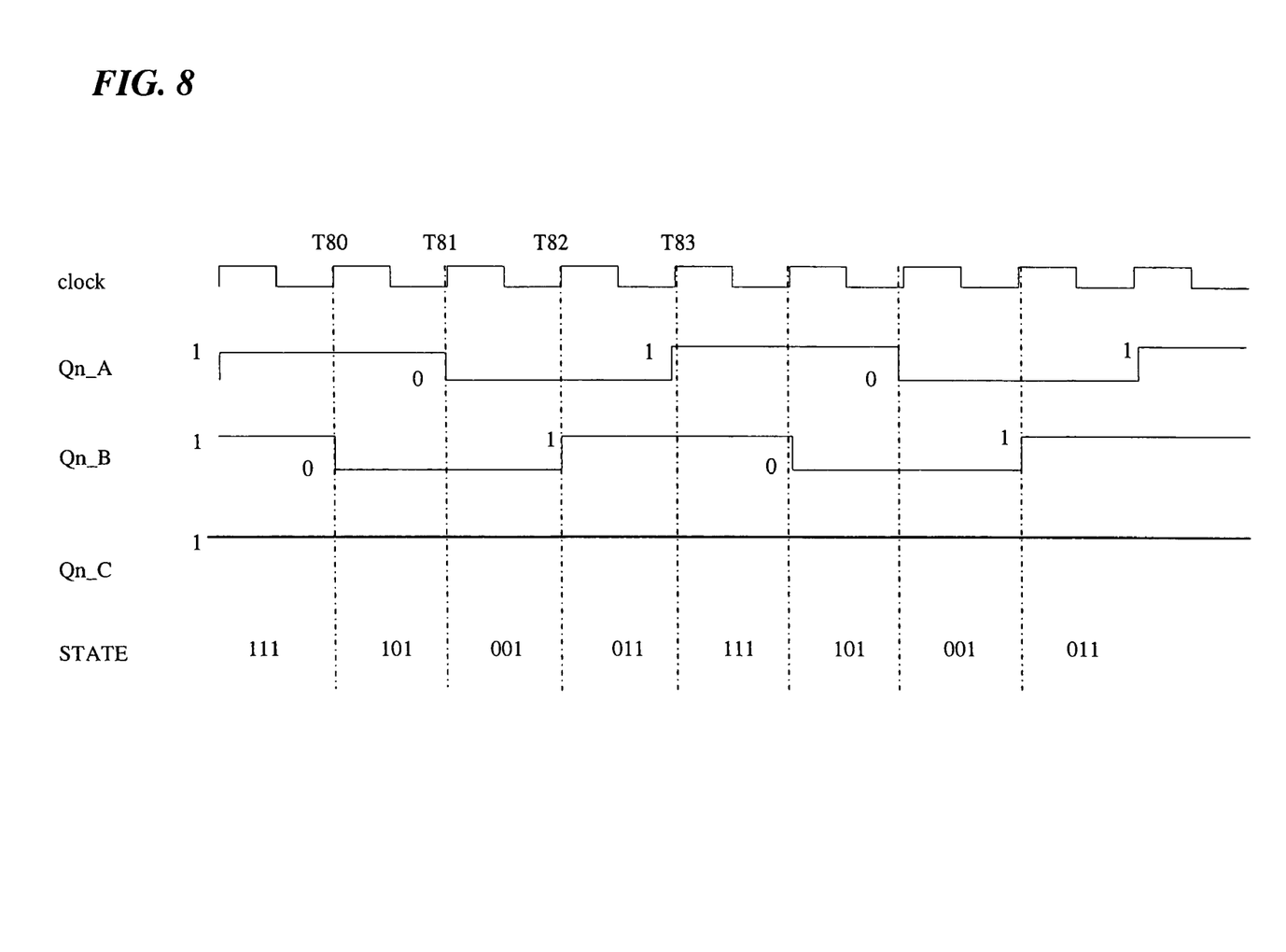
FIG. 8 shows a timing diagram of states of a divide-by-4-or-5 module serving as a divide-by-4 module in the high-speed prescaler shown in FIG. 7.

FIG. 8 illustrates the timing of high-speed prescaler 15 serving as a divide-by-4 module when the signal div5_enb is set to logic "1". Described above, the signal Qn_C is logic "1" as long as the signal div5_enb is logic "1". At the beginning, a signal Qn_A of a Flip-Flop 73 and a signal Qn_B of a Flip-Flop 74 are also logic "1." Because signal Qn_B and signal Qn_C are both logic "1", NAND 77 outputs a logic "0" that is input into a D-terminal of a Flip-Flop 73. On the rising edge of the clock signal, which is input at clock terminal 79 at time T80, Flip-Flop 73 latches the logic "0" from NAND gate 77 and Flip-Flop 74 latches the logic "1" of signal Qn_A. Meanwhile, the logic "1" state of signal Qn_A that is input into a D-terminal of the Flip-Flop 74 causes Flip-Flop 74 to change the signal Qn_B from logic "1" to logic "0". During the clock cycle starting at time T80, then, signals Qn_A, Qn_B, and Qn_C become logic "1", logic "0", and, because of gate 75, logic "1", respectively. Flip-Flops 73, 74, and 76 similarly change state at times T81, T82, T83, as shown in FIG. 8. Thus, when high-speed prescaler 15 runs at divide-by-4, its state (i.e., the values of Qn_A, Qn_B, and Qn_C) changes in the sequence of "111", "101", "001" and "011". When high-speed prescaler 15 runs at divide-by-5, its state changes in the sequence of "111", "101", "000", "010" and "011". As shown in FIG. 7, high-speed prescaler 15 functions when the signal starten is a logic "1" and is reset to its initial conditions when the signal resetb is strobed.

As shown in FIG. 7, a NAND 78 transmits a logic "0" as a signal flagn in the "011" state, and transmits a logic "1" as the signal flagn at all other states. The "011" state of the prescaler is used to trigger a low flagn signal in order to realize the proper phase-switching, whether high-speed prescaler 15 runs at divide-by-4 or divide-by-5.

As shown in FIG. 6, if a signal Sys_frac_en that is input into a terminal 62 is a logic "0," the signal fracen is always logic "0" and PSP 18 runs as a general high-speed prescaler.

When a signal fracen, which is input into shift-registers 63a, 63b, 63c, is logic "0", the signal fracen makes shift-register signals s1, s2, and s3 become logic "1", "0", "0", respectively. With shift-register signals s1, s2, and s3 at logic state "1", "0", "0", respectively, and signal fracen at logic "0", the signals starten1, starten2, and starten3 are in the state "1", "0", "0", respectively. The logic "1" state of signal s1 that is input into a phase selection unit 66a allows signal ck1 to be transmitted as a signal clksum, and the logic "0" state of signals s2 and s3, which are input into phase selection units 66b and 66c, respectively, prevent signals ck2 and ck3 from being transmitted. The logic "1" state of signal starten1 activates high-speed prescaler 15a, and the logic "0" state of signals starten2 and starten3 keep the other two high-speed prescalers 15b and 15c standing on the "011" state. If the signal Sys_frac_en is changed to logic "1", the PSP 18 is ready and waiting for the phase-switching command signal Frac_pfd.

Figure 9:
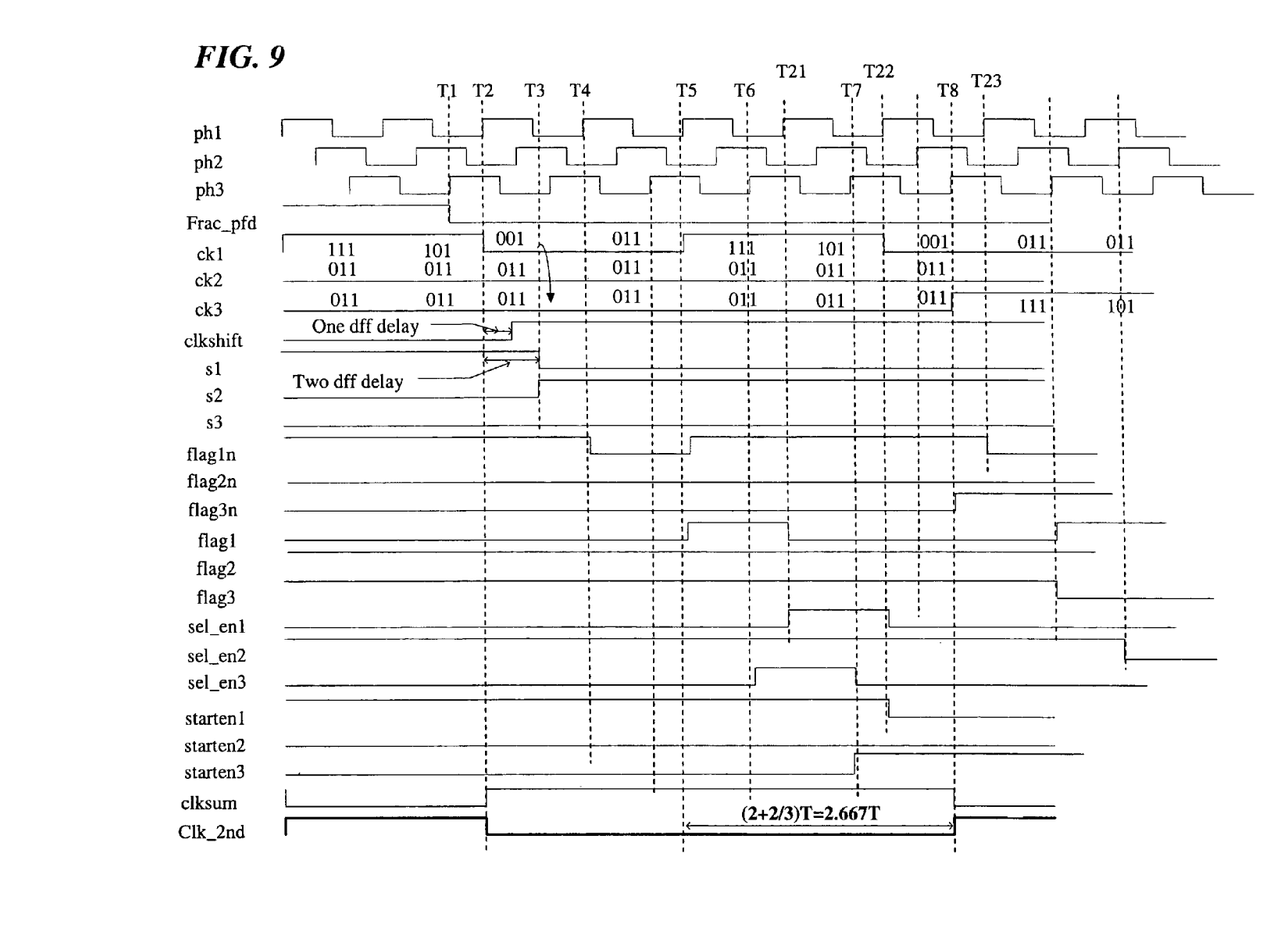
FIG. 9 illustrates waveforms of signals at an embodiment of a pre-selection prescaler as shown in FIG. 4.

FIG. 9 illustrates the timing waveforms of signals at the PSP 18 shown in FIG. 6. The phase-switching starts when a negative edge of the signal Frac_pfd is provided at time T1. High-speed prescaler 15a (PRESCALER1) shown in FIG. 6 that transmits the signal ck1 at the lower frequency in accordance with states of high-speed prescaler 15a. The signal ck1 has a negative edge at time T2 when the state of high-speed prescaler 15a becomes state "001". The negative edge of signal ck1 causes a positive edge of a signal clksum, which is transmitted from an inverter 65a to be supplied into an inverter 67 and a Flip-Flop 64. Then, inverter 67 provides a negative edge of the signal Clk_2nd at time T2. Flip-Flop 64 then transmits a signal clkshift having a positive edge at time T2, which is synchronized to signal ph1 and to signal ck1, with some definite delay. The signal clkshift makes the shift-register signals s1, s2, and s3 turn to states "0", "1", "0", respectively, at time T3. As a result, at time T3 signal s2 becomes a logic "1" input into the phase selection unit 66c shown in FIG. 6 and the signal clksum is switched from signal ck1 to signal ck3 at time T3, without glitch.

The operation of high-speed prescaler 15c (PRESCALER3) is explained below. A signal flag1n shown in FIG. 9 is a flag indicating that the state of high-speed prescaler 15a (PRESCALER1) is "011". As shown in FIG. 9, the signal flag1n indicates logic "0" when the state of high-speed prescaler 15a is "011." After shift-register signals s1, s2, and s3 turn to "0", "1", "0" at time T3, high-speed prescaler 15a continues counting until signal flag1n becomes logic "0" at time T4.

When the state of high-speed prescaler 15a changes from "001" to "011" at time T4, the signal flag1n becomes logic "0". Consequently, the subsequent positive edge of signal ph1 at time T5 causes a signal flag1 to become "1" and a positive edge of a signal flag1 occurs at time T5. When the signal flag1 at logic "1" is input into a NAND 68, as shown in FIG. 6, NAND 68 transmits a signal "0" as a signal k3 because the signal flag3 is also logic "1" at time T5, as shown in FIG. 9. Then, the subsequent positive edge of signal ph3 at time T6 samples the signal k3 that is input into a D-terminal of a Flip-Flop 69, shown in FIG. 6. Then, the Flip-Flop 69 transmits a logic "1" signal as signal sel_en3 at time T6. When the positive edge of signal sel_en3 is input into a selector 600, the selector 600 selects signal s2 as the next value of signal starten3 that is transmitted from a Qn-terminal of a Flip-Flop 601. As shown in FIG. 9, the signal s2 has become logic "1" already at time T6. Thus, the subsequent positive edge of signal ph3 at time T7 makes signal starten3 become logic "1." The logic "1" state of signal starten3 activates high-speed prescaler 15c (PRESCALER3).

Once activated, high-speed prescaler 15c starts counting at the subsequent positive edge of signal ph3, which occurs at time T8 when a signal flag3n becomes logic "1." High-speed prescaler 15c transmits the signal ck3, which at time T8 is at logic "1." A positive edge of the signal ck3 at time T8 causes a negative edge of the signal clksum, which is transmitted from an inverter 65c and subsequently supplied into an inverter 67. Then, inverter 67 provides a positive edge of the signal Clk_2nd at time T8.

In a similar manner, high-speed prescaler 15c transmits the signal flag3n in accordance with state of high-speed prescaler 15c, and activates high-speed prescaler 15b in accordance with the signal flag3 and the signal s3. High-speed prescaler 15b transmits the signal flag2n in accordance with state of high-speed prescaler 15b, and activates high-speed prescaler 61a in accordance with the signal flag2 and the signal s1.

High-speed prescaler 61a (PRESCALER1) is stopped in the fashion described below. When the signal flag1 becomes logic "1" at time T5, the logic "1" state of signal flag1 is input into a NAND 602, as shown in FIG. 6. NAND 602 then transmits a logic "0" as a signal k1 because the signal flag2 is also logic "1" at time T5, as shown in FIG. 9. The subsequent positive edge of the signal ph1 at time T21 samples the signal k1 that is input into a D-terminal of a Flip-Flop 603, as shown in FIG. 6. Consequently, Flip-Flop 603 transmits a logic "1" state of signal sel_en1 at time T21. When the logic "1" signal sel_en1 is input into a selector 604, selector 604 selects signal s1 as the next value of starten1 that is transmitted from a Qn-terminal of a Flip-Flop 605.

As shown in FIG. 9, the signal s1 has become logic "0" already at time T21. Thus, the subsequent positive edge of signal ph1 at time T22 makes signal starten1 become logic "0". The logic "0" state of signal starten1 stops high-speed prescaler 15a (PRESCALER1) and high-speed prescaler 15a remains in state "011" from the positive edge of the signal ph1 at time T23.

In a similar manner, high-speed prescaler 15b transmits the signal flag2n in accordance with state of high-speed prescaler 15b, and is stopped in accordance with the signal flag2 and the signal s3. High-speed prescaler 15c transmits the flag3n in accordance with the state of high-speed prescaler 15c, and is stopped in accordance with the signal flag3 and the signal s2.

As described above, high-speed prescalers 15a, 15b, and 15c are alternately activated and stopped to transmit the signal ck1, the signal ck2, and the signal ck3 in turn. Thus, the phase selection units 66a, 66b, 66c allow the signals ck1, ck2, and ck3 to be transmitted in turn.

As shown in FIG. 9, the waveform of Clk_2nd is logic "0" at time T5 and logic "1" at time T8. As shown, the time period of the signal Clk_2nd is longer than the time period of the signal "ck1" by $(2+\frac{2}{3})$ time periods of the signal ph1 $((2+\frac{2}{3})*\text{Tperiod\_ph1})$. In other words, when the signal Frac_pfd triggers the PSP 18, the period of time "$(2+\frac{2}{3})*\text{Tperiod\_ph1}$" is inserted into a single cycle of the signal Clk_2nd by the phase-switching. Therefore, as shown in FIG. 9, the signal Clk_2nd is divided by $(N+2+\frac{2}{3})$. If feedback divider 17 is programmed to divide-by-$(N+\frac{2}{3})$, PSP 18 and programmable counter 19 shown in FIG. 5 are set to count $(N-2)$ to reduce by the period of signal $f_{fb}$ by "$2*\text{Tperiod\_ph1}$". Thus, reducing "2" from $(N+2+\frac{2}{3})$, the signal $f_{fb}$ becomes a divide-by-$(N+\frac{2}{3})$ signal of signal ph1. If feedback divider 17 is programmed to divide-by-$(N+\frac{1}{3})$, PSP 18 and programmable counter 19 are set to count $(N-5)$ and the signal Frac_pfd triggers PSP 18 to insert "$(5+\frac{1}{3})*\text{Tperiod\_ph1}$" using the phase-switching twice. Consequently, reducing "5" from $(N+5+\frac{1}{3})$, the signal $f_{fb}$ becomes a divide-by-$(N+\frac{1}{3})$ signal. If feedback divider 17 is programmed to divide-by-N, the signal Frac_pfd is set to hold and PSP 18 runs as a general prescaler to transmit a divide-by-N signal as the signal $f_{fb}$. As described above, the signal Phase shown in FIG. 4 is used to inform that the fraction part is "⅓" or "⅔".

According to some embodiments, feedback divider 17 utilizes the three phase-separated clocks of the VCO to realize divide-by-(N+⅓) or (N+⅔) as a given fractional-N divider. Phase-locked loop (PLL) 10, shown in FIG. 1, with feedback divider 17 as illustrated in FIG. 5 may realize 1.19 GHz clock switching without glitch in a 0.35 μm technology. PLL 10 may be designed to handle 1.19 GHz or higher frequency limits of VCO 13 in the same technology. PLL 10 may follow the principles of the present invention using area to obtain high frequency performance.

For illustrative purposes, certain embodiments of the invention have been specifically described above. However, other embodiments are intended to be included within the scope of this disclosure. Therefore, this disclosure is not intended to be limiting to the particular embodiments described herein. The scope of the invention is therefore limited only by the following claims.

What is claimed is:

1. A frequency divider comprising:
a phase selection circuit that switches between a plurality of phase-separated signals in response to a fractional control signal to generate a second clock signal;
a counter that receives the second clock signal and generates the fractional control signal and a transition control signal, the fractional control signal providing when the second clock signal should switch states in response to a transition of the selected clock signal, the counter generating a feed-back clock signal; and
a plurality of high-speed prescalers that receive a plurality of high-frequency phase-separated signals having an identical frequency and generate the plurality of phase-separated clock signals that are at a lower frequency based on the transition control signal from the counter, the plurality of high-speed prescalers being coupled to provide the plurality of phase-separated clock signals to the phase selection circuit, wherein:
the phase-selection circuit generates the second clock signal based on the plurality of the lower frequency phase-separated clock signals; and
the plurality of high-speed prescalers further includes:
a first high-speed prescaler receiving a first high-frequency signal and transmitting a first phase separated clock signal;
a second prescaler receiving a second high-frequency signal and transmitting a second phase-separated clock signal; and
a third prescaler receiving a third high-frequency signal and transmitting a third phase separated clock signal;
wherein the first, the second, and the third prescalers and the counter are set to count a reduced number of cycles "N" to adjust a time period of the divided signal, where N is an integer greater than or equal to 1; and
wherein a divide-by-N+⅓ function is achieved by switching between the first clock signal, the second clock signal, and the third clock signal in turn after the reduced number of cycles of one of the plurality of high-frequency signals.

2. A frequency divider comprising:
a phase selection circuit that switches between a plurality of phase-separated signals in response to a fractional control signal to generate a second clock signal;
a counter that receives the second clock signal and generates the fractional control signal and a transition control signal, the fractional control signal providing when the second clock signal should switch states in response to a transition of the selected clock signal, the counter generating a feed-back clock signal; and
a plurality of high-speed prescalers that receive a plurality of high-frequency phase-separated signals having an identical frequency and generate the plurality of phase-separated clock signals that are at a lower frequency based on the transition control signal from the counter, the plurality of high-speed prescalers being coupled to provide the plurality of phase-separated clock signals to the phase selection circuit, wherein:
the phase-selection circuit generates the second clock signal based on the plurality of the lower frequency phase-separated clock signals; and
the plurality of high-speed prescalers further includes:
a first high-speed prescaler receiving a first high-frequency signal and transmitting a first phase separated clock signal;
a second prescaler receiving a second high-frequency signal and transmitting a second phase-separated clock signal; and
a third prescaler receiving a third high-frequency signal and transmitting a third phase separated clock signal;
wherein the first, the second, and the third prescalers and the counter are set to count a reduced number of cycles "N" to adjust a time period of the divided signal, where N is an integer greater than or equal to 1; and
wherein a divide-by-N+⅔ function is achieved by alternately switching between the first clock signal, the second clock signal, and the third clock signal in turn after the reduced number of cycles of one of the plurality of high-frequency signals.

3. A method of frequency dividing, comprising:
receiving a plurality of phase-separated clock signals having an identical frequency;
switching between the plurality of phase-separated clock signals in response to a first switch signal to generate a plurality of selected clock signals;
generating a second clock signal based on the selected clock signals in response to a second switch signal; and
generating the first and second switch signals after a number of cycles "N" of one of the plurality of phase separated clock signals;
wherein N is an integer greater than or equal to 1; and
wherein the phase-separated clock signals are divided by a number selected from the group consisting of N+⅓, N+⅔, and N+1.

4. The method of claim 3, wherein the plurality of phase-separated clock signals are high frequency signals and generating the first and second switch signals is achieved after N cycles of one of the plurality of phase-separated clock signals.

5. The method of claim 4, wherein generating the second clock signal includes:
receiving the selected clock signal into a high-speed prescaler, the high-speed prescaler providing the second clock signal that has lower frequency than the selected clock signal.

6. The method of claim 4, further including:
receiving a plurality of high-frequency clock signals into a plurality of high-speed prescalers; and
generating the plurality of lower frequency phase-separated clock signals that correspond to the plurality of high frequency clock signals.

* * * * *